United States Patent [19]

Louw

[11] 3,978,418
[45] Aug. 31, 1976

[54] LOW FREQUENCY ELECTRO-THERMAL FILTER

[75] Inventor: Wynand Jakobus Louw, Randburg, South Africa

[73] Assignee: University Patents, Inc., Stamford, Conn.

[22] Filed: Jan. 10, 1975

[21] Appl. No.: 539,975

[52] U.S. Cl. .............................. 330/23; 330/30 D; 357/28
[51] Int. Cl.² ........................................ H03F 1/32
[58] Field of Search................... 330/23, 143, 30 D; 357/28

[56] References Cited
UNITED STATES PATENTS

| | | | |
|---|---|---|---|
| 3,321,716 | 5/1967 | Lyon-Caen | 357/28 X |
| 3,383,614 | 5/1968 | Emmons et al. | 330/23 |
| 3,445,777 | 5/1969 | Amodei | 330/23 |

Primary Examiner—R. V. Rolinec
Assistant Examiner—Lawrence J. Dahl
Attorney, Agent, or Firm—Mason, Kolehmainen, Rathburn & Wyss

[57] ABSTRACT

A low frequency electro-thermal filter includes a pair of thermally coupled transistorized differential amplifiers. One of the differential amplifiers comprises a pair of heater transistors and the other differential amplifier includes a pair of sensor transistors, each heater transistor and its associated sensor transistor being fabricated on a single semiconductor chip. The heater transistors in the first differential amplifier serve differentially to heat the sensor transistors in the second differential amplifier in response to an input signal. The differential heating of the second differential amplifier differentially affects the electrical parameters of the sensor transistors and tends to upset the current balance between the stages of the second differential amplifier. A feedback loop is provided around the second differential amplifier for reestablishing the current balance thereof. The feedback signal has a rate of response that is dependent on the thermal response of the thermal coupling between the two differential amplifiers, and may be monitored to provide a filtered output signal.

The characteristics of the filter are determined by the thermal characteristics of the thermal coupling and by the electrical characteristics of the second differential amplifier and the feedback loop. The thermal characteristics of the thermal coupling are determined by the size, shape, thermal conductivity and thermal capacity of the semi-conductor chip forming the heater and sensor transistors and its associated substrate. The size, shape and placement of the heater and sensor transistors may be adjusted to select whether the thermal characteristics of the chip or the insulator primarily determine the thermal transfer function.

25 Claims, 9 Drawing Figures

CASE 1
$u_{nm}=0$
EXCEPT FOR
n ODD AND
m EVEN.

CASE 2
$u_{nm}=0$
EXCEPT FOR
n EVEN AND
m EVEN.

CASE 3
$u_{nm}=0$
EXCEPT FOR
(n+m) ODD

CASE 4
$u_{mn}=0$
EXCEPT FOR
(n+m) EVEN

CASE 5
$u_{nm}=0$
EXCEPT FOR
n ODD

CASE 6
$u_{nm}=0$
EXCEPT FOR
n EVEN

CASE 7
$u_{nm}=0$
FOR n AND m
BOTH ODD,
AND FOR n=m

CASE 8
$u_{nm}=0$
FOR n AND m
BOTH ODD

CASE 9
DUAL
INTEGRATORS

LOW FREQUENCY ELECTRO-THERMAL FILTER

BACKGROUND OF THE INVENTION

This invention relates generally to filters, and more particularly, to low frequency filters employing the thermal properties of electrical devices to provide the filtering function.

Low frequency high pass, low pass, band pass and band-elimination filters are well known. Such filter generally employ large value resistors, inductors or capaitors to achieve the low frequency filtering function. Other such devices utilize the capacity multiplying effects of a Miller integrator to synthesize an apparent large value capacitor for a low frequency filter. Still other circuits employ active components to provide the filtering function and utilize feedback techniques or digital sampling techniques. Attempts at synthesizing electro-thermal low pass filters have also been made. One such attempt is described in a doctoral dissertation entitle "Electro-Thermal Integrated Circuits" submitted by Paul Russel Gray to the University of Arizona in 1969.

Whereas these techniques provide a way to achieve low frequency filtering, the use of high value resistors, capacitors, and inductors results in bulky and expensive structures that are not particularly suitable for modern miniaturized equipment. The use of Miller integrators results in a filter having a limited quality factor and dynamic range. Analog active filters tend to be rather complex and oscillatory, and generally must rely on precision components to provide the filtering function. Digital active filters also tend to be complex and require relatively complex clock circuitry to make them operate. Previous attempts to fabricate electro-thermal filters have not been entirely satisfactory because of the complexity of the mathematical formulas involved, and the undesirability of the multiple pole transfer functions that resulted from such previous attempts at filter synthesis. Furthermore, the electrical characteristics of the prior art filters tend to be dependent on the ambient temperature.

Accordingly, it is an object of the present invention to provide a new and improved low frequency filter.

It is another object of the present invention to provide an improved filter that provides low frequency filtering without the use of inductors or capacitors as frequency determining elements.

Yet another object of the present invention is to provide a new and improved low frequency filter that is relatively simple and inexpensive to produce.

A further object of the present invention is to provide a readily realizable electro-thermal filter having only a single predominant pole in its transfer function in the frequency range of interest.

Another object of the present invention is to provide an electro-thermal filter having a transfer function that is relatively independent of the ambient temperature.

Another object of the present invention is to provide a low frequency filter that is compatible with miniaturized electronic equipment and which can readily be fabricated using semiconductor techniques.

In accordance with a preferred embodiment of the invention, the thermal properties of transistor amplifiers are used to provide the filtering function. A first transistor amplifier, generally a differential amplifier, is fabricated on a semiconductor chip. The first amplifier is used differentially to heat the second amplifier in response to an input signal applied to the first amplifier. The second amplifier is thermally coupled to the first amplifer, preferably by fabricating portions of the two amplifiers on the same semiconductor chip and bonding the chip to an insulating substrate. The heat applied to the second amplifier changes one of its operating characteristics, such as the current balance between transistors, in response to the heat generated by the first amplifier. The thermal transfer function of the thermal coupling between amplifiers determines the poles and zeros of the electrical transfer function of the filter. A feedback network is provided around the second amplifier to stabilize the operating point of the second amplifier, the feedback loop thereby providing a signal representative of the input signal filtered by the action of the thermal coupling.

The use of differential amplifiers as heating and sensing elements causes common mode signals, such as those occurring as a result of changes in the ambient temperature, to be rejected. The size, shape and position of the heater and sensor transistors is selected to cancel various poles in the transfer function such that a single pole response is approximated. In addition, the size, shape and position of the heater and sensor transistors may be adjusted to determine whether the thermal characteristics of the semiconductor chip or those of the substrate primarily determine the filter transfer function. This provides increased design flexibility and the ability to select the frequency range of the filter by utilizing either the thermal characteristics of the semiconductor chip, those of the substrate, or a combination of both to determine the dominant pole.

The above and other objects and advantages of the present invention will appear from the following detailed description of the invention in conjunction with which reference is made to the accompanying drawings, wherein.

DETAILED DESCRIPTION OF THE PREFERRED EMBODIMENT

Figure 1:
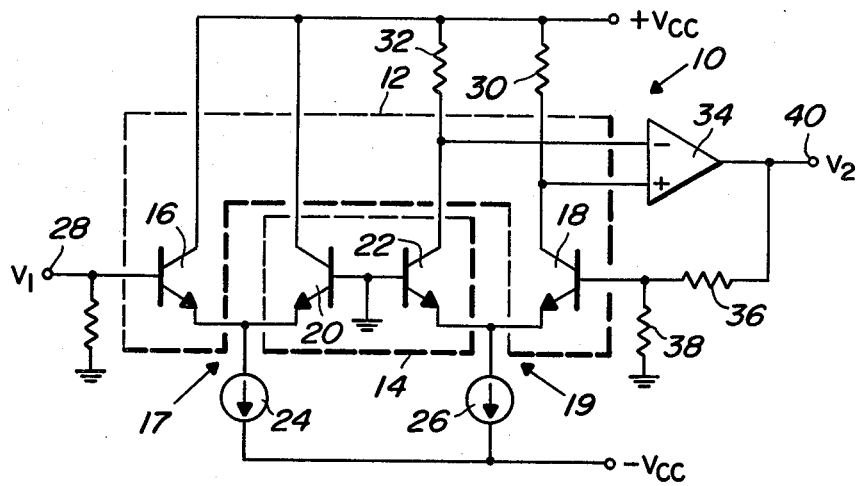
FIG. 1 is a simplified schematic diagram of the filter according to the invention included to show the principle of operation of the invention.

Referring now to the drawing with particular reference to FIG. 1, there is shown a relatively simple embodiment of the electro-thermal filter according to the invention, designated as a whole by the numeral 10. The filter 10 is fabricated on two separate semiconductor chips, in this embodiment, a pair of silicon chips 12 and 14 designated by dashed lines. The chip 12 contains a pair of thermally coupled transistors 16 and 18, and the second chip 14 contains a similar pair of thermally coupled transistors 20 and 22. The emitters of the transistors 16 and 20, each of which is located on a different one of the chips 12 and 14, are connected together to form an emitter coupled pair, in this embodiment, a differential amplifier 17. Similarly, the transistors 18 and 22 are connected to form a second differential amplifier 19. The common emitters of each of the differential amplifiers are connected to a pair of current sources 24 and 26.

The differential amplifer 17 serves as a heater for differentially heating the transistors 18 and 22 comprising the differential amplifier 19 to provide a thermal filtering action as follows. As the signal to be filtered is applied to the input 28 of the filter, the conductivity of the transistors 16 is varied in accordance with the amplitude of the applied signal. Because the constant current source 24 provides a relatively constant current to the two transistors 16 and 20, any change in conductivity of the transistor 16 which causes a change in the amount of current flowing therethrough will cause a corresponding opposite change in the current flowing through the transistor 20 to maintain the sum of the currents flowing through the transistors 16 and 20 constant. As a result, the current flowing through each of the transistors 16 and 20 will vary in synchronism with the fluctuations in the signal voltage applied to the input 28, and the amount of heat dissipated by each of the transistors 16 and 20 will vary in proportion to the amount of current flowing through each of the transistors.

Because the transistors 16, 18; and 20, 22 are mounted in closely proxime pairs, respectively, on the respective chips 12 and 14, heat generated by the transistor 16 will be transferred to the transistor 18, and heat generated by the transistor 20 will similarly be transferred to the transistor 22.

The forward junction drop of most semiconductor devices varies as an inverse exponential function of temperature. Consequently, when one of the transistors 18 and 22 is heated by the corresponding one of the transistors 16 and 20, the base to emitter voltage of the heated transistor will drop. Because the temperature of transistors 16 and 20 varies differentially, one of the sensing transistors 18 and 22 is heated while the other one of the sensing transistors 18 and 22 is simultaneously cooled. This results in a decrease in the base to emitter voltage of one of the sensing transistors 18 and 22 and a simultaneous increase in the base to emitter voltage of the other sensing transistors 18 and 22. Because the base to emitter junction drop of a transistor must be overcome before current can flow through the transistor, any reduction in the amplitude of the base to emitter voltage results in an increase in the corresponding base to emitter current, and consequently, in the collector current of the transistor. As a result, the differential heating of the transistors 18 and 22 tends to increase the collector current of the heated transistor while simultaneously reducing the collector current of the less heated transistor a corresponding amount. Since the collector current of the transistors 18 and 22 flows through a pair of collector resistors 30 and 32, respectively, any change in the relative collector currents of the transistors 18 and 22 will be reflected as a corresponding change in the voltage drop across the resistors 30 and 32.

The aforementioned change in the voltage drop across the resistors 30 and 32 may be sensed directly to provide an output voltage that is representative of the input voltage as modified by the filtering action of the thermal filter 10. However, the difference in voltage across the resistors 30 and 32 is not a linear function of temperature and cannot be used to sense large temperature differences. In a differential amplifier without feedback, the difference in collector voltages, V out, is given by the following equation:

$$V_{out} = \frac{2\alpha \Delta T \gamma R}{r}$$

where
- $\alpha$ = the common base current gain $\cong$ 1
- $\gamma$ = the temperature coefficient of the base to emitter forward voltage drop $\cong$ 2 mv/°C
- $\Delta T$ = the temperature difference between transistors
- $r = (kT_o/qI)$
- $T_o$ = the average temperature around which the variations $T$ occur (ambient temperature)
- $q$ = the electron charge
- $k$ = Boltzmanns constant
- $I$ = the bias current through each transistor From the above equations we can see that if the temperature differential $\Delta T$ gets too large, the change in output voltage will not vary linearly with the change in temperature difference. Also since $r$ is a function of the ambient temperature, the output voltage is not only a function of the temperature difference, but also of the ambient temperature. Hence, without feedback, a differential amplifier temperature sensor is usable only as a small signal device.

In order to increase the dynamic range and linearity of the filter, a feedback loop comprising an operational amplifier 34 and a pair of resistors 36 and 38 is connected around the differential amplifier 19. The feedback loop eliminates the non-linearities encountered in differential amplifiers without feedback. This makes the temperature sensor usable for sensing large temperature changes, and also makes the sensor independent of the ambient temperature. The operational amplifier 34 is an amplifier responsive to the difference in potential applied to its inputs. The amplifier 34 is connected to the differential amplifier 19 in the polarity necessary to provide negative feedback around the amplifier 19 so as to tend to maintain the current flowing through each of the transistors 18 and 22 substantially constant. As a result, any change in the base to emitter voltages tending to change the relative collector currents flowing through the transistors 18 and 22 will result in the application of a correction voltage to the base of the transistor 18 to maintain the collector currents substantially constant. This correction voltage is proportional to the difference in temperature of the two transistors 18 and 22, and hence representative of the input voltage as modified by the thermal transfer function of the filter 10. The correction voltage is applied to an output point 40 and serves as the output signal of the filter 10. Because the differential amplifiers 17 and 19 and the operational amplifier 34 are only responsive to voltage and temperature differences, and not to common mode signals, the characteristics of the filter will not change appreciably with changes in ambient temperature.

Figure 2:
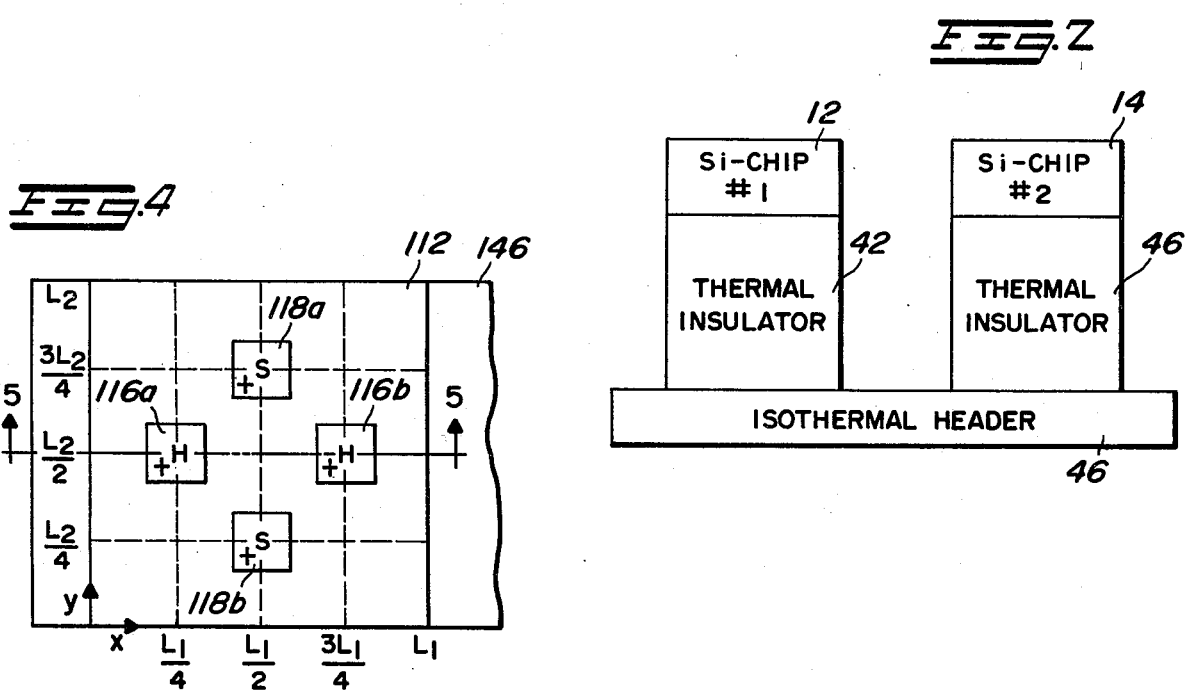
FIG. 2 is a side view of the mechanical structure of the filter according to the invention.

The physical construction of the filter 10 is shown in FIG. 2 in order to illustrate the thermal properties of the filter. Each of the silicon chips 12 and 14 is mounted on a respective thermal insulating substrate 42 and 44, respectively. The insulating substrates may be fabricated from a thermal insulator commonly known as H-film or other suitable thermal insulating material and serve thermally to isolate the two chips 12 and 14. In order to further improve the isolation between the two chips 12 and 14, the thermal insulating substrates 42 and 44 are mounted to an isothermal header 46. The isothermal header provides the thermal equivalent of an electrical ground connection, and prevents any heat that may be transferred through one of the thermal insulating substrates 42 and 44 from being transferred to the other thermal insulating substrate. As a result, the semiconductor chips 12 and 14 are relatively well isolated thermally, and each of the heater transistors 16 and 20 affects the temperature of only its respective sensor transistors 18 and 22. This assures independent heating of each of the sensor transistors 18 and 22 to assure the desired differential heating effects.

Figure 3:
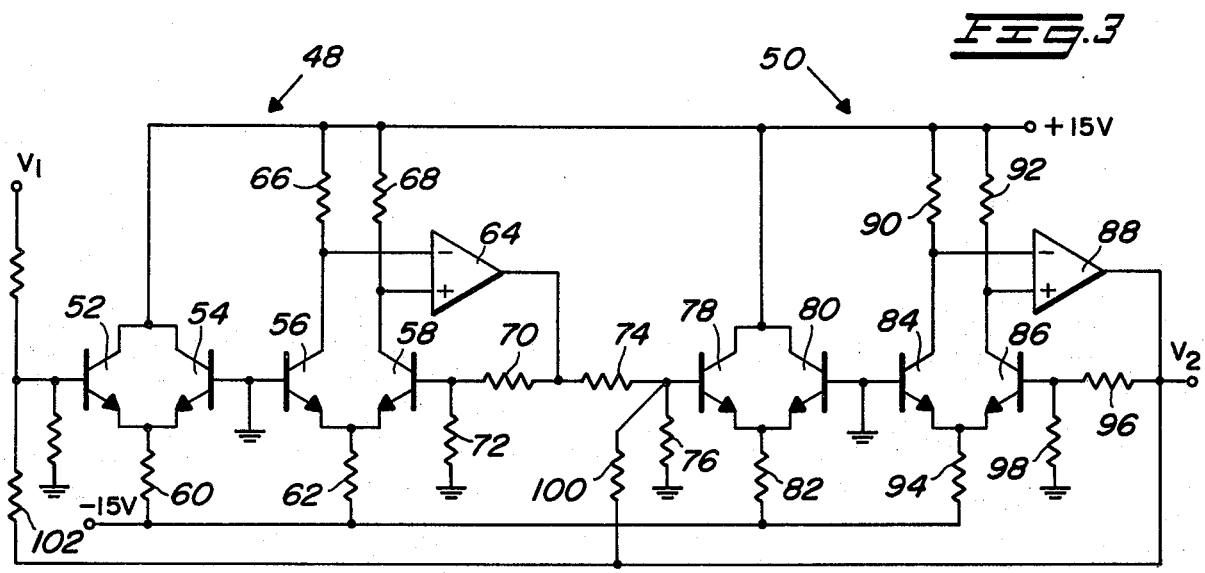
FIG. 3 is a schematic circuit diagram of a practical embodiment of a low pass filter utilizing the principles of the present invention.

FIG. 3 shows a practical embodiment of a low pass electro-thermal filter. The low pass electro-thermal filter shown in FIG. 3 comprises two stages, a first stage generally designated by the reference numeral 48 and a second stage generally designated as 50. Each of the stages 48 and 50 is similar to the filter 10 shown in FIG. 1, and the two stages are cascaded to provide additional selectivity. The first stage 48 comprises a pair of differentially coupled transistors 52 and 54 which serve as heater transistors and a second pair of differentially coupled transistors 56 and 58 which serve as sensor transistors. The emitters of the transistors 52 and 54 are connected to a relatively high value resistor 60 which operates as a current source, and the emitters of the transistors 56 and 58 are connected to a similar resistor 62, also operating as a current source. Feedback is provided by means of an operational amplifier 64 connected to the junctions of the collectors of the transistors 56 and 58 and a pair of respective collector resistors 66 and 68. Local feedback from the amplifier 64 is applied to the transistor 58 by means of a voltage divider comprising a pair of transistors 70 and 72.

The output of the amplifier 64 is also applied to the input of the second stage 50 by means of a voltage divider comprising a pair of resistors 74 and 76 connected to the base of a heater transistor 78. As in the case of the first stage 48, a second heater transistor 80 is differentially coupled to the heater transistor 78, and a resistor 82 is connected to the common emitter junction of the transistors 78 and 80. A pair of sensor transistors 84 and 86 are thermally coupled to the respective transistors 78 and 80, and provide an output to the feedback amplifier 88 connected to the junctions of the collectors of the transistors 84 and 86 and a pair of collector resistors 90 and 92. A common emitter resistor 94 is employed as a current source, and local feedback is provided from the output of the amplifier 88 to the transistor 86 by means of a voltage divider comprising a pair of resistors 96 and 98.

In addition to the local feedback provided by the amplifier 88 to the transistor 86, feedback is provided to the input of the transistor 78 by means of a feedback transistor 100 and to the input of the transistor 52 by means of a coupling resistor 102. The additional feedback path provides additional flexibility of design to permit a more complex filter to be synthesized.

When designing filters of the type described in FIG. 3, it is desirable that the thermal transfer functions between the heater and the sensor amplifiers have only a single pole in the frequency range of interest. This greatly simplifies the mathematics involved in the synthesis of the filter, and eliminates the possibility of oscillation occurring at the frequency of any higher order poles.

The poles and zeros of the transfer function of the thermal coupling between a heater and a sensor are determined by the physical geometry of the heater and the sensor and by the thermal conductivity and capacity of the semiconductor chip and the insulator substrate. Generally, the transfer function has multiple poles and zeros, and is too complex to be conveniently analyzed or utilized in a practical circuit. As previously discussed, it is desirable to utilize a thermal system having a single pole transfer function to simplify the filter design, and an important feature of the present invention is to permit such single pole thermal transfer functions to be synthesized. This is accomplished by selecting specific heater and sensor configurations which generate zeros in the transfer function for cancelling all of the transfer function poles, except one, within the frequency range of interest to approximate a single pole filter.

Figure 4:
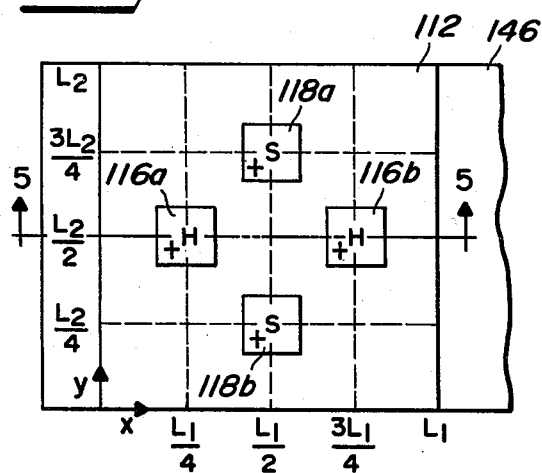
FIG. 4 is a top view of a semiconductor chip useable with the electro-thermal filter according to the invention showing the shape and location of the heaters and the sensors.
Figure 5:
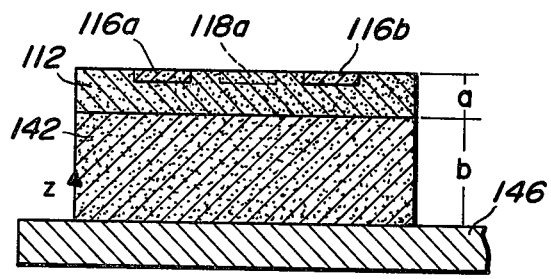
FIG. 5 is a side view of the semiconductor and mounting structure taken along line 5—5 of FIG. 4.

The thermal conductivity and thermal capacity of silicon, from which the heaters and sensors are generally fabricated, are much higher than the thermal conductivity and capacity of the insulating substrate. In practical systems, the thickness of the silicon chip is small compared to the other chip dimensions. As a result of the high thermal conductivity and small thickness of the chip, the temperature of the chip is substantially constant throughout its thickness and varies only in the $x$ and $y$ directions along the surface of the chip (FIG. 4). In the insulator, which is shunted by the high conductivity silicon chip in the $x$ and $y$ directions, heat flows only in the z direction (FIG. 5). Utilizing these assumptions, Paul R. Gray synthesized the following equation defining the transfer function of the thermal system in his previously mentioned Doctor of Philosophy thesis entitled "Electro-Thermal Integrated Circuits" submitted to the University of Arizona in 1969, and incorporated herein by reference.

The thermal transfer function of the electrothermal filter is approximated by the following equations:

$$F(S) = \frac{4\sqrt{\omega_x \omega_y}}{K_S a A_S A_N} \sum_{n=0}^{\infty} \sum_{m=0}^{\infty} \frac{H_{nm} S_{nm}}{[S(n)+1][S(m)+1][S+(n\pi)^2\omega_x + (m\pi)^2\omega_y + \omega_i]} \quad (1)$$

$$H_{nm} = \int_0^{L_1} \int_0^{L_2} \omega_H(x,y) \cos\frac{n\pi x}{L_1} \cos\frac{m\pi y}{L_2}\, dx\, dy \quad (2)$$

$$S_{nm} = \int_0^{L_1} \int_0^{L_2} \omega_S(x,y) \cos\frac{n\pi x}{L_1} \cos\frac{m\pi y}{L_2} dx\, dy \qquad (3)$$

Where:

| | |
|---|---|
| $\omega_x = \frac{k_x}{\Phi_x C_x L_1^2}$ | $k_x$ is the thermal conductivity of the chip |
| $\omega_y = \frac{k_i}{\Phi_x C_x L_2^2}$ | $k_i$ is the thermal conductivity of the insulator |
| $\omega_i = \frac{k_i}{\Phi_x C_x ab}$ | $s$ is the density of the chip material |
| $S(n) = \begin{cases} 1 \text{ if } n=0 \\ 0 \text{ if } n \ne 0 \end{cases}$ | $C_x$ is the specific heat of the chip material |
| $S(m) = \begin{cases} 1 \text{ if } m=0 \\ 0 \text{ if } m \ne 0 \end{cases}$ | |
| $\omega_H(X,Y) = \begin{cases} +1 \text{ everywhere inside the heater} \\ -1 \text{ everywhere inside the second heater when differential heaters are used} \\ 0 \text{ everywhere else} \end{cases}$ | |
| $\omega_S(X,Y) = \begin{cases} +1 \text{ everywhere inside the sensor} \\ -1 \text{ everywhere inside a second differential sensor} \\ 0 \text{ everywhere else} \end{cases}$ | |

$A_H$ and $A_S$ are the total areas of the heaters and sensors, respectively $a$ is the thickness of the chip $b$ is the thickness of the insulator From these equations, we determine that the poles of the thermal transfer function are determined by the physical dimensions and the thermal properties of the silicon chip and insulator, while the zeros are determined by the geometrical position and shape of the heater and sensor areas. This permits us to select one of the poles in the transfer function as the dominant pole in the region of interest by adjusting the geometrical position and shape of the heater and sensor areas to cause the zeros to cancel the remaining poles.

An example of the geometrical spacing and positioning of the heater and sensors for cancelling all but the lowest frequency pole within the frequency range of interest is illustrated in FIG. 4. This can be predicted from equations (1), (2), and (3) above. Solving equations (2) and (3) for the geometry shown in FIG. 4 results in the cancellation of all poles in equation (1) except that pole occurring at $-\omega_i$ and higher frequency poles occurring $-16\pi^2\omega_x$, $-32\pi^2\omega_x$, $-36\pi^2\omega_x$, etc. Typically, the higher frequency poles are at least an order of magnitude higher in frequency than the pole occurring at $-\omega_i$, and are not detrimental to filter operation.

The silicon chip 112 shown in FIG. 4 which may be used as the chip 12 in the circuits of FIGS. 1 and 2. A second similar chip (not shown) would be used as the chip 14 to complete the differential structure. The silicon chip 112 comprises a pair of heaters 116a and 116b which serve the same function as the heater transistor 16 of FIG. 1, and a pair of sensors 118a and 118b which serve the same function as the transistor 18 of FIG. 1. The chip 112 and the heaters and sensors 116a, 116b, 118a and 118b are illustrated as squares in FIG. 4, but a rectangular geometry may also be used to achieve a similar result. The heaters 116a and 116b and the sensors 118a and 118b may be standard transistors, with the transistors forming the heaters 116a and 116b being connected in parallel, and the transistors forming the sensors 118a and 118b also being connected in parallel. Alternatively, any heat dissipating elements, such as a resistor, may be used as the heaters 116a and 116b, and any temperature responsive elements such as diodes may be used as the sensors 118a and 118b without affecting the thermal transfer function of the chip 112 which is determined only by the geometry and placement of the heaters and sensors 116a, 116b, 118a and 118b, and by the thermal properties of the silicon chip 112 and the thermal insulator 142 (FIG. 5) to which it is bonded.

According to an important aspect of the invention, because of the symmetrical placement of the heaters 116a and 116b and the sensors 118a and 118b, each being positioned on a center line of the chip 112 and located a distance approximately one-fourth of the linear dimension of the chip away from an edge of the chip, many of the terms of the general equation defining the thermal transfer function of the chip cancel, and the thermal transfer function of the chip 112 is determined primarily by the thermal resistance of the insulator and the thermal capacity of the silicon chip. This increases the number of degrees of freedom available for synthesizing the thermal transfer function by permitting the independent adjustment of the dimensions of the silicon chip 112 and the insulator 142 to provide the desired thermal capacity of the chip 112 and the thermal conductivity of the insulator 142.

This feature can be more readily understood with the aid of FIG. 5. The heat that is generated by the heaters 116a and 116b, which operate in parallel, is transferred laterally to the sensors 118a and 118b through the parallel combination of the chip 112 and the insulator 142. However, as previously discussed, because of the physical location of the heaters and sensors in the chip 112 and because of the higher thermal conductivity of the chip 112 with respect to the conductivity of the insulator 142, the primary lateral heat flow path is through the chip 112, and any lateral heat flow through the insulator 142 is negligible and may be neglected. The heaters 116a and 116b and the sensors 118a and 118b are placed in close proximity to each other. Consequently, as a result of the relatively low thermal resistance to silicon, if the thermal capacity of the silicon chip 112 were low, the flow of heat between the heaters 116a and 116b and the sensors 118a and 118b would be substantially instantaneous. However, because of the finite thermal mass of the chip 112, the flow of heat between the heaters and the sensors proceed at a finite rate therby introducing a time lag between the time the heat is generated by the heaters 116a and 116b and the time it is sensed by the sensors 118a and 118b.

The insulator 142 provides a thermal path between the chip 112 and the isothermal header 146. Consequently, heat generated by the heaters 116a and 116b passes through the chip 112, the insulator 142 and into the isothermal heaer 146. Because the thermal conductivity of the chip 112 is high, the primary resistance in the path between the heaters 116a and 116b and the isothermal header 146 is the thermal resistance of the insulator 142. As a result, the insulator 142 serves to "bleed" heat from the chip 112 into the isothermal header 146. The amount of heat thus removed from the chip 112 affects the amount of heat subsequently applied to the sensors 118a and 118b, and serves to further increase the time lag between the generation of the heat by the heaters 116a and 116b and the sensing of the heat by the sensors 118a and 118b.

The thermal capacity of the insulator 142 is low relative to the thermal capacity of the chip 112. Consequently, the thermal capacity of the insulator 142 has very little effect on the thermal transfer function, as does the thermal resistance of the chip 112 due to the high thermal conductivity of the chip 112 and the physical placement of the heaters 116a ad 116b and the sensors 118a and 118b. This leaves the thermal mass of the chip 112 and the thermal resistance of the insulator 142, the latter providing the main heat flow path in the vertical direction, as the main contributors to the thermal transfer function.

Figure 6:
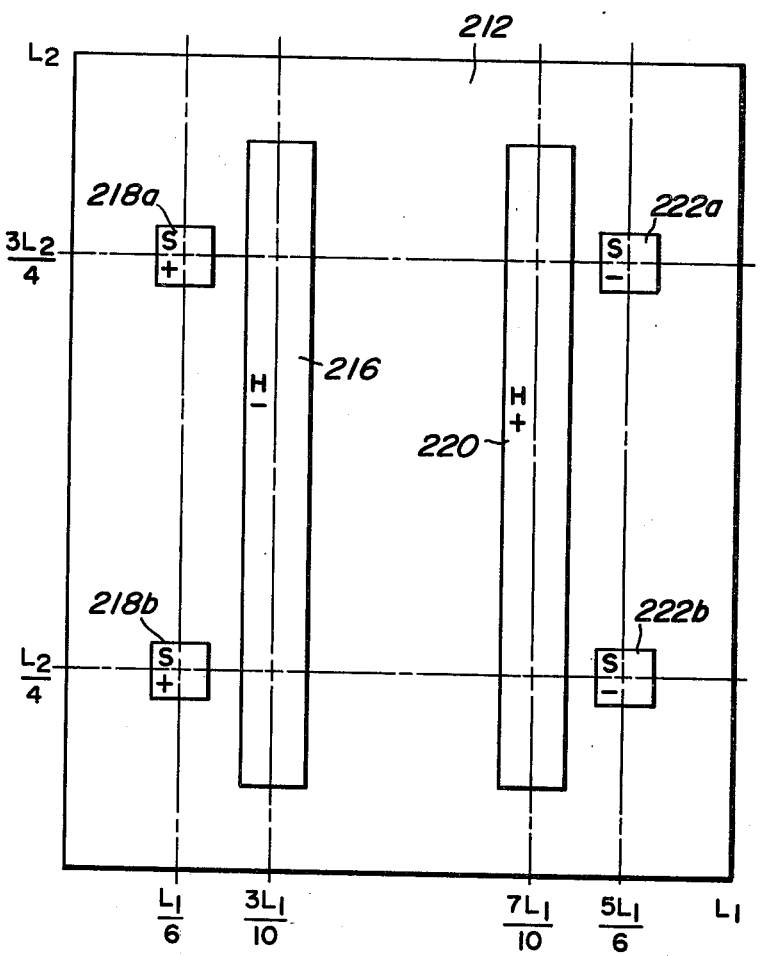
FIG. 6 is a top view of a semiconductor chip showing alternately shaped and placed heaters and sensors.

An alternative embodiment of an electro-thermal filter according to the invention is shown in FIG. 6. FIG. 6 shows a semiconductor chip 212 having a pair of heaters 216 and 220 analogous to the heater transistors 216 and 220 of FIG. 1 and two pairs of sensors 218a, 218b and 222a, 222b, analogous to the sensor transistors 18 and 22, respectively, of FIG. 1. The heaters 216 and 220 operate differentially, and the sensors 218a and 218b are connected in parallel as are the sensors 222a and 222b; however, it is not necessary to use parallel connected sensors, and a single sensor, disposed on the horizontal center line of the chip may be used in conjunction with each of the heaters 216 and 220. Because of the length of the heaters 216 and 220, the flow of heat from the heaters 216 and 220 is primarily lateral, in the $x$ direction, with the lateral heat flow being a primary determining factor of the thermal transfer function. The amount of heat flow in the vertical direction is limited, and the insulator plays only a minor role in the determination of the thermal transfer function, and solving equations (1), (2) and (3) results in non-zero poles at $-\pi^2\omega_x$, $-17\pi^2\omega_x$, $-37\pi^2\omega_x$, $-49\pi^2\omega_x$, etc. Because the thermal conductivity of silicon is much higher than that of an insulator, the first pole (at $-\pi^2\omega_x$) typically occurs at a much higher frequency than the frequency of the first pole (at $-\omega_i$) of the transfer function where vertical heat transfers through the insulator is a frequency determining factor.

Figure 7:
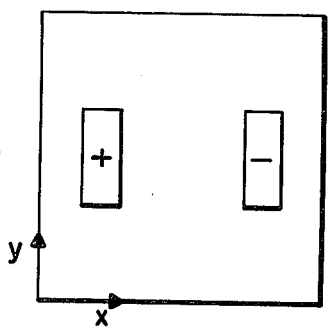
FIG. 7 is a top view of a semiconductor chip showing various alternative shapes and placements of heaters and sensors and the mathematical results obtained from such placement.
Figure 7:
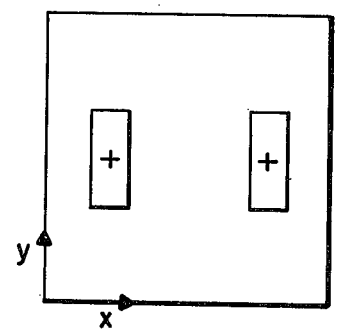
Figure 7:
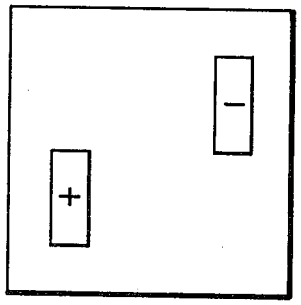
Figure 7:
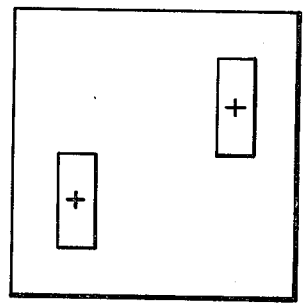
Figure 7:
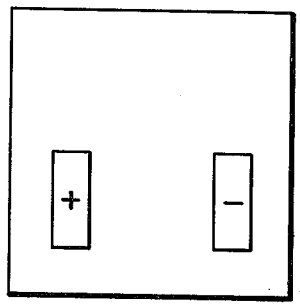
Figure 7:
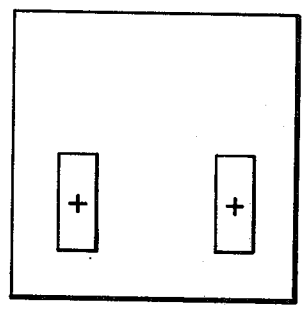
Figure 7:
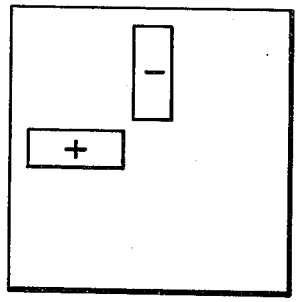
Figure 7:
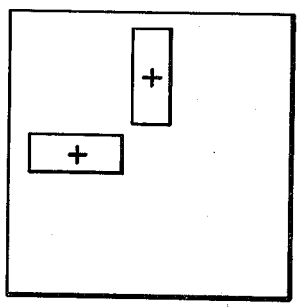
Figure 7:
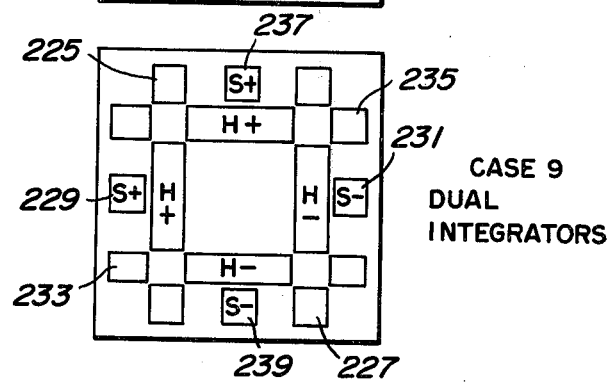

The physical geometry of the heaters and sensors determines which of the poles are cancelled by zeros, and, therefore, the heaters and sensors must be fabricated with great accuracy to achieve the desired results. Fortunately, this can be readily accomplished with present day semiconductor fabrication techniques. In addition, more than one integrator can be fabricated on a single semiconductor chip if the symmetrics are selected to make the individual integrators non-interacting. One example of more than one integrator fabricated on a single chip is shown in FIG. 7, case 9. The chip illustrated in FIG. 7, case 9 utilizes the same lateral heat flow utilized by the chip illustrated in FIG. 6 to provide the filtering action; however, two independent sets of heaters 225, 227 and 233, 235 are used. The heaters 225 and 227 are differentially connected and radiate heat primarily in a horizontal direction to a pair of differentially connected sensors 229 and 231. The heaters 223 and 235 radiate heat primarily in a vertical direction to a pair of sensors 237 and 239. The sensors 229 and 231 are spaced mid-way between the differentially connected heaters 233 and 235. As a result, the sensors 229 and 231 are not affected by the heaters 233 and 235. This occurs because the differential connection causes the sum of the heat generated by the heaters 233 and 235 to remain constant, and the central placement of the sensors 229 and 231 causes each sensor to be affected equally by both of the heaters 233 and 235. As a result, the increase in heat generated by one of the heaters 233 and 235 is negated by the decrease in heat generated by the other one of the heaters 233 and 235, and the sensors 229 and 231 are not affected by the heaters 233 and 235. Similarly, the sensors 237 and 239 are not affected by the heaters 225 and 227.

Other possible symmetrical geometrics for differential thermal filters are illustrated in FIG. 7 with the values of n and m providing those zeros being listed next to the respective geometrics. The term $U_{nm}$ is a general term which may be used either as $H_{nm}$ or $S_{nm}$ in equations (1), (2) and (3).

Although any thermal sensor may be used in conjunction with the electro-thermal filters according to the invention, the thermal sensors of the type shown in FIGS. 1 and 3 are particularly advantageous because they provide a substantially linear voltage versus temperature characteristic. For example, in the sensor 19 shown in FIG. 1, the two transistors 18 and 22 are identical transistors, formed on separate chips, and differentially heated and cooled. The two transistors 18 and 22 have identical collector resistors 30 and 32, and because the feedback loop consisting of the operational amplifier 34 and the resistors 36 and 38 forces the collector voltages of the transistors 18 and 22 to be equal, the collector currents of the two transistors 18 and 22 will also be equal. As the temperature of one of the transistors changes with respect to the temperature of the other transistor, the base to emitter voltage drop of that transistor will change, thereby tending to cause an unbalance in the collector currents of the two transistors. This unbalanced condition will be sensed by the differential amplifier 34 as a difference in the voltages appearing across the collector resistors 30 and 32. This voltage difference will be amplified by the amplifier 34 and fed back to the base of the transistor 18 to again tend to equalize the collector currents. The amount of feedback required to balance the collector currents of the two transistors 18 and 22 is directly proportional to the difference in the temperatures of the transistors 18 and 22. As a result, the output voltage of the operational amplifier 34 may be sensed at the output point 30 to provide an indication of the temperature difference between the transistors 18 and 22. The amplifier 19 thus acts as a differential thermometer, with the sensitivity of the thermometer being determined by the values of the resistors 30, 32 and 36, 38. It is also a large-signal thermometer because the feed loop tends to maintain the currents through the transistors 18 and 22 substantially constant, thereby greatly increasing the dynamic range of the system.

In the embodiments heretofore described, all of the heaters and sensors have been symmetrical differential devices. Such differential devices are advantageous because common mode thermal and electrical signals are rejected. Consequently, the effects of common mode electrical signals, such as hum and noise appearing on the power line are minimized, and common mode thermal effects resulting from changes in the ambient temperatures are also minimized. As a result, the transfer function of the filter remains relatively constant with temperature and does not change appreciably in amplitude or phase as do single ended systems.

Figure 8:
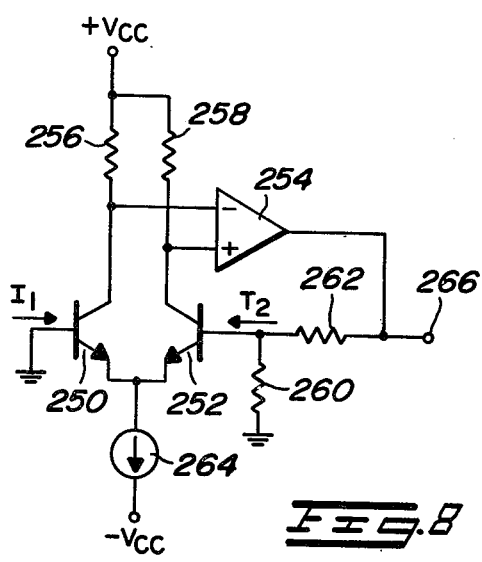
FIG. 8 is a schematic circuit diagram showing an electronic thermometer useable as a sensor for the electrothermal filter according to the invention.

An alternative form of thermal sensor is illustrated in FIG. 8. The thermal sensor illustrated in FIG. 8 comprises first and second sensor transistors 250 and 252, a feedback operational amplifier 254, a pair of collector resistors 256 and 258, a voltage divider in the feedback loop comprising resistors 260 and 262, and a current source 264. The structure shown in FIG. 8 is a differential structure electrically, but it is not, by itself, a differential structure thermally, but rather acts as an absolute thermometer because both of the transistors 250 and 252 are mounted on the same chip and are heated and cooled simultaneously. However, a differential thermal circuit may be constructed by employing a differential heater and employing two sensors of the type illustrated in FIG. 8, each one of the sensors being heated by a different one of the differential heaters. For example, each of the sensors 218a, 218b, 222a and 222b (FIG. 6) may be fabricated from a circuit such as the one illustrated in FIG. 8. The sensors 218a and 222a may then be connected in a differential circuit and the outputs thereof compared to provide an indication in the difference in temperature therebetween. A similar configuration may be employed in conjunction with the sensors 218b and 222b.

In the thermometer circuit illustrated in FIG. 8, the transistors 250 and 252 are identical; however, the values of the resistors 256 and 258 are not. As in the differential thermal sensing circuit described above, the operational amplifier 254 in the feedback loop tends to keep the collector voltages of the two transistors 250 and 252 equal. Because the values of the resistors 256 and 258 are unequal, the collector currents of the transistors 250 and 252 must be correspondingly different to maintain the collector voltages substantially equal.

The forward voltage versus temperature characteristic of the semiconductor diode is dependent upon the density of the current flowing through the junction. Because the transistors 250 and 252 are identical and have different collector currents flowing through them, the current density of the collector current, and hence the current density of the base current of the transistors 250 and 252 must be unequal. Consequently, the transistors 250 and 252 will respond differently to the same change in temperature, thereby requiring a change in the output voltage from the operational amplifier 254 to maintain the collector voltages of the transistors 250 and 252 equal. This change in output voltage of the operational amplifier 254 may be sensed to provide an indication of the temperature of the transistors 250 and 252.

The equations for two identical diodes (e.g. base-emitter diodes) at the same temperature carrying different currents are:

$$I_1 = I_S(T) \exp \frac{qV_1}{mkT} \qquad (4)$$

$$I_2 = I_S(T) \exp \frac{qV_2}{mkT} \qquad (5)$$

where $I_1$ and $I_2$ are the respective forward currents
$V_1$ and $V_2$ are the respective forward voltages
$T$ is the absolute temperature
$q$ is the electronic charge
$m$ is a constant
$k$ is Boltzmann's constant, and
$I_S(T)$ is the reverse leakage current from which we get $$(V_1 - V_2) = \frac{mkT}{q} \ln \frac{I_1}{I_2} \qquad (6)$$

and consequently the output voltage $V_{out}$ at the output point 266 of FIG. 7 is:

$$V_{out} = \frac{R_{262} + R_{260}}{R_{260}} \frac{mkT}{q} \ln \frac{R_{256}}{R_{258}} \qquad (7)$$

where $R_{256}$, $R_{258}$, $R_{260}$ and $R_{262}$ are the resistances of the respectively numbered resistors in FIG. 8.

From the above equations we can see that the output voltage is directly proportional to the absolute temperature of the chip, and the scale factor of the thermometer (number of milivolts per degree Kelvin) can be adjusted to a convenient value by setting the value of the resistors 260, 262 and the ratio of the collector resistors 256 and 258. This results because the resistors 256 and 258 determine the ratio of the collector currents of the transistors, and hence $I_1$ and $I_2$, and the voltage division ratio of the resistors 260 and 262 determines the output voltage $V_{out}$ necessary to compensate for the difference in the emitter voltage ($V_1-V_2$) of the transistors 250 and 252.

Although in the embodiments discussed above, the transistors 250 and 252 are identical, this need not necessarily be the case. All that is necessary is that the collector current densities of the two transistors be fixed and unequal. However, in the preferred embodiment, identical transistors having unequal collector resistors are used because the current density through the junctions need not be calculated and only the relative collector currents need be known, thereby greatly simplifying the design procedure. In an alternative embodiment, transistors having different emitter areas may be used in conjunction with equal collector resistors.

Figure 8A:
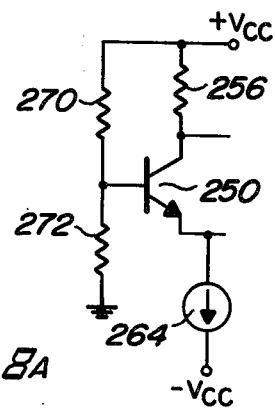
FIG. 8a shows a biassing variation for the circuit of FIG. 8 for making the sensor of FIG. 8 responsive to variations in temperature from a predetermined reference temperature.

Instead of providing an output voltage directly proportional to the absolute temperature, the output voltage may be referenced to any predetermined reference temperature by biasing the base of one of the sensing transistors, for example, the transistor 250, to a predetermined reference voltage. Under such conditions, the voltage applied to the base of the transistor 250, $V_{B250}$ will be $$V_{B250} = \frac{R_{270}}{R_{270} + R_{272}} V_{cc} \qquad (8)$$

where $R_{270}$ and $R_{272}$ are the resistances of the respectively numbered bias resistors in FIG. 8a, and $V_{cc}$ is the supply voltage, and the voltage at the base of the transistor 252, $V_{B252}$ will be equal to $$V_{B252} = \frac{R_{260}}{R_{260} + R_{262}} V_{out} \qquad (9)$$

Rearranging equation (7), we get $$\frac{R_{260}}{R_{260}+R_{262}} V_{out} = \frac{mkT}{q} \ln \frac{R_{256}}{R_{258}} = V_{B252} \quad (10)$$

and similarly, $$\frac{R_{272}}{R_{270}+R_{272}} V_{cc} = \frac{mkTo}{q} \ln \frac{R_{256}}{R_{258}} = V_{B250} \quad (11)$$

where $To$ is any desired reference temperature. The base to base voltage $V_{BB}$ is:

$$V_{BB} = V_{B252} - V_{B250} = \frac{R_{260}}{R_{260}+R_{262}} V_{out} - \frac{R_{272}}{R_{270}+R_{272}} V_{cc} \quad (12)$$

Substituting equations (10) and (11) into equation (12) we get:

$$V_{BB} = \frac{mkT}{q} \ln \frac{R_{256}}{R_{258}} - \frac{mkTo}{q} \ln \frac{R_{256}}{R_{258}} \quad (13)$$

Hence if we adjust $R_{270}$ and $R_{272}$, then from equation (11), we can make $T0$ any desired value, and adjust $V_{BB}$ accordingly as shown in equation (13). Because $V_{out}$ is dependent on the base to base voltage $V_{BB}$, the output voltage $V_{out}$ of the thermometer shown in FIG. 8 can be referenced to any desired temperature.

While certain preferred embodiments of the invention have been described by way of illustration, many modifications will occur to those skilled in the art; it will be understood, of course, that it is not desired that the invention be limited thereto, since modifications may be made, and it is, therefore, contemplated by the appended claims to cover any such modifications as fall within the true scope and spirit of the invention.

What is claimed as new and desired to be secured by Letters Patent of the United States is:

1. An electro-thermal filter comprising:
   an electrical input terminal;
   an isothermal header;
   an insulating layer bonded to said header, said insulating layer having a predetermined thermal conductivity and thermal capacity;
   a second layer bonded to said insulating layer, said second layer having a thermal conductivity and a thermal capacity higher than the thermal conductivity and thermal capacity of said insulating layer, the relative thermal conductivities and thermal capacities of said insulating layer and said second layer affecting the frequency characteristics of the electrothermal filter;
   a differential heater electrically coupled to said input terminal having first and second heating members disposed on said second layer, said heating members being differentially coupled to each other electrically for causing the amount of heat generated by one of said heating members to be increased and the amount of heat generated by the other of said heating members to be simultaneously decreased in response to a change in an electrical signal applied to said input terminal;
   a differential heat sensor having first and second electrically coupled sensing members disposed on said second layer, said first sensing member being thermally coupled to said first heating member and said second sensing member being thermally coupled to said second heating member through said second layer;
   an electrical output terminal; and
   means electrically coupling said differential heat sensor to said output terminal for applying an output signal to said output terminal representative of the difference in temperature of said first and second heat sensing members.

2. An electro-thermal filter as recited in claim 1 wherein each of said differential heating members includes first and second heater sections and each of said differential sensing members includes first and second sensor sections.

3. An electro-thermal filter as recited in claim 2 wherein the heater sections comprising each heating member are symmetrically disposed about a first axis, and the sensor sections comprising each sensing member are symmetrically disposed about a second axis, the disposition about each of said axes affecting the frequency response of the electro-thermal filter.

4. An electro-thermal filter as recited in claim 3 wherein said first and second axes are perpendicular to each other.

5. An electro-thermal filter as recited in claim 2 wherein the first and second heater sections comprising each heating member are electrically connected to each other and the first and second sensor sections comprising each sensing member are electrically connected to each other.

6. An electro-thermal filter as recited in claim 5 wherein said first and second heater sections and said first and second sensor sections are each connected together in parallel, respectively.

7. An electro-thermal filter as recited in claim 1 wherein said heaters and said sensors each have a predetermined shape and placement for rendering the thermal transfer function of said electro-thermal filter dependent primarily on the thermal conductivity of said insulator and the thermal capacity of said second layer.

8. An electro-thermal filter having an electrical signal input point and an electrical signal output point, said filter comprising:
   an amplifier having an input and an output;
   means for heating a portion of said amplifier, said heating means being electrically coupled to said electrical signal input point and responsive to an electrical signal applied to said electrical input point for generating heat in response thereto, said heating means tending to alter said electrical operating point of said output;
   means for thermally coupling said heating means to said amplifier;
   a feedback loop electrically coupling the output to the input of said amplifier, said feedback loop being operative to provide a signal to said input for stabilizing changes in the electrical operating point of said output caused by said heating means; and
   means electrically coupling said feedback loop to said electrical signal output point for monitoring the signal required to stabilize the electrical operating point of said output and providing an output point signal representative of said stabilizing signal, said output point signal being a filtered representation of the signal applied to said electrical input point.

9. An electro-thermal filter as recited in claim 8 wherein said amplifier is a transistor amplifier.

10. An electro-thermal filter as recited in claim 9 wherein said heating means includes a transistor.

11. An electro-thermal filter as recited in claim 10 wherein said amplifier includes a differential amplifier having first and second differentially connected transistor stages, and wherein said heating means includes third and fourth differentially connected transistor stages, said third stage being thermally coupled to said first stage.

12. An electro-thermal filter as recited in claim 11 wherein said thermally coupled stages are fabricated on a single semiconductor chip.

13. An electro-thermal filter as recited in claim 11 wherein said fourth stage is thermally coupled to said second stage.

14. An electro-thermal filter as recited in claim 13 wherein said first and third stages are fabricated on a first semiconductor chip and wherein said second and fourth stages are fabricated on a second semiconductor chip thermally isolated from said first semiconductor chip.

15. An electro-thermal circuit comprising:
first and second junction transistors each having input, output, and common electrodes, said transistors being electrically coupled together to form a differential amplifier providing substantially equal voltages at said output electrodes and having substantially equal current densities flowing through respective junctions of said junction transistors;
means for applying thermal energy to one of said first and second transistor means, said thermal energy tending to make the voltages appearing at said output electrodes unequal;
a feedback circuit connected to said output electrodes and to the input electrode of said first transistor means, said feedback circuit being responsive to a difference in the voltages appearing at said output electrodes for providing a signal to said input electrode of said first transistor for equalizing the inequality in the voltages appearing at said output electrodes caused by said thermal energy; and
means coupled to said feedback circuit for providing an output signal representative of the equalizing signal provided by said feedback circuit, said output signal being responsive to the temperature of said one of said first and second transistor means.

16. An electro-thermal circuit as recited in claim 15 further including means for applying thermal energy to the other one of said first and second junction transistors, said feedback network being responsive to the difference in temperature between said first and second junction transistors for causing said output signal providing means to provide a signal representative of the difference in temperature between said first and second junction transistors.

17. An electro-thermal circuit as recited in claim 16 wherein said first and second junction transistors are substantially identical and have substantially equal currents flowing through the output electrodes thereof.

18. An electro-thermal circuit as recited in claim 15 wherein said output signal is substantially linearly related to the difference in the temperatures of said junctions.

19. An electro-thermal filter as recited in claim 1 wherein said second layer is formed from semiconductor material and said differential heater and said differential sensor are integrally formed in said semiconductor layer.

20. An electro-thermal filter as recited in claim 19 wherein said second layer is split into two sections, each containing one of said heating members and one of said sensing members.

21. An electro-thermal filter as recited in claim 19 wherein said semiconductor layer is fabricated from silicon.

22. An electro-thermal filter as recited in claim 1 wherein each of said heating members includes a heat generating transistor and each of said sensing members includes a heat sensing transistor.

23. An electro-thermal filter as recited in claim 12 further including an isothermal header and a thermal insulator, said thermal insulator being mounted on said isothermal header and said semiconductor chip being mounted on said thermal insulator, said thermal insulator thermally insulating said semiconductor chip from said isothermal header, said semiconductor chip, said thermal insulator and said isothermal header thereby forming said thermal coupling means.

24. An electro-thermal filter as recited in claim 23 wherein said thermally coupled stages are disposed on said semiconductor chip at predetermined spacings and said thermal insulator has a predetermined thermal conductivity and thermal capacity, the spacing between said thermally coupled stages and the thermal conductivity and thermal capacity of said thermal insulator being selected to provide a desired thermal coupling characteristic of said thermal coupling means, said last-mentioned characteristic being selected to determine the electrical filtering characteristic of the electro-thermal filter.

25. An electro-thermal filter as recited in claim 24 wherein said semiconductor chip has a thermal conductivity and thermal capacity higher than the thermal conductivity and thermal capacity of said thermal insulator, and wherein said thermally coupled stages have a predetermined shape, said shape and placement being selected to render the thermal response of said thermal coupling means dependent primarily on the thermal conductivity of said thermal insulator and on the thermal capacity of said semiconductor chip.

* * * * *